(12) United States Patent
Nishiguchi et al.

(10) Patent No.: US 9,082,621 B2
(45) Date of Patent: Jul. 14, 2015

(54) METHOD FOR MANUFACTURING SILICON CARBIDE SINGLE CRYSTAL, AND SILICON CARBIDE SUBSTRATE

(75) Inventors: Taro Nishiguchi, Itami (JP); Shin Harada, Osaka (JP); Makoto Sasaki, Itami (JP)

(73) Assignee: SUMITOMO ELECTRIC INDUSTRIES, LTD., Osaka-shi, Osaka (JP)

( * ) Notice: Subject to any disclaimer, the term of this patent is extended or adjusted under 35 U.S.C. 154(b) by 880 days.

(21) Appl. No.: 13/378,493

(22) PCT Filed: Feb. 25, 2011

(86) PCT No.: PCT/JP2011/054307
§ 371 (c)(1),
(2), (4) Date: Dec. 15, 2011

(87) PCT Pub. No.: WO2011/158532
PCT Pub. Date: Dec. 22, 2011

(65) Prior Publication Data
US 2012/0275984 A1 Nov. 1, 2012

(30) Foreign Application Priority Data
Jun. 15, 2010 (JP) ................. 2010-136209

(51) Int. Cl.
| | |
|---|---|
| *H01L 21/02* | (2006.01) |
| *H01L 21/20* | (2006.01) |
| *H01L 21/205* | (2006.01) |
| *C30B 23/02* | (2006.01) |
| *C30B 23/06* | (2006.01) |
| *C30B 29/36* | (2006.01) |
| *C30B 33/06* | (2006.01) |

(52) U.S. Cl.
CPC ........ *H01L 21/02631* (2013.01); *C30B 23/025* (2013.01); *C30B 23/063* (2013.01); *C30B 23/066* (2013.01); *C30B 29/36* (2013.01); *C30B 33/06* (2013.01); *H01L 21/02378* (2013.01); *H01L 21/02447* (2013.01); *H01L 21/02529* (2013.01); *H01L 21/02658* (2013.01)

(58) Field of Classification Search
None
See application file for complete search history.

(56) References Cited

U.S. PATENT DOCUMENTS 5,127,983 A * 7/1992 Imai et al. ............ 117/85
6,153,166 A 11/2000 Tanino
(Continued)

FOREIGN PATENT DOCUMENTS

| JP | 11-29397 | 2/1999 |
|---|---|---|
| JP | 11-228296 | 8/1999 |
| JP | 2003-68592 | 3/2003 |

(Continued)

*Primary Examiner* — Anita Alanko
(74) *Attorney, Agent, or Firm* — Drinker Biddle & Reath LLP

(57) ABSTRACT

Each of first and second material substrates made of single crystal silicon carbide has first and second back surfaces, first and second side surfaces, and first and second front surfaces. The first and second back surfaces are connected to a supporting portion. The first and second side surfaces face each other with a gap interposed therebetween, the gap having an opening between the first and second front surfaces. A closing portion for closing the gap over the opening is formed. A connecting portion for closing the opening is formed by depositing a sublimate from the first and second side surfaces onto the closing portion. The closing portion is removed. A silicon carbide single crystal is grown on the first and second front surfaces.

11 Claims, 14 Drawing Sheets

(56) References Cited

U.S. PATENT DOCUMENTS

| | | |
|---|---|---|
| 7,314,520 B2 | 1/2008 | Powell et al. |
| 8,168,515 B2 * | 5/2012 | Sasaki et al. .................. 438/478 |
| 2004/0187766 A1 | 9/2004 | Letertre |
| 2011/0306181 A1 * | 12/2011 | Sasaki et al. .................. 438/459 |
| 2012/0015499 A1 | 1/2012 | Sasaki et al. |
| 2012/0017826 A1 * | 1/2012 | Nishiguchi et al. ........... 117/106 |
| 2012/0126251 A1 * | 5/2012 | Sasaki et al. .................... 257/77 |

FOREIGN PATENT DOCUMENTS

| | | | |
|---|---|---|---|
| JP | 2003257804 A | * | 9/2003 |
| JP | 2004-172556 | | 6/2004 |
| WO | 01/18872 | | 3/2001 |
| WO | WO 2011/058830 | | 5/2011 |

* cited by examiner

METHOD FOR MANUFACTURING SILICON CARBIDE SINGLE CRYSTAL, AND SILICON CARBIDE SUBSTRATE

TECHNICAL FIELD

The present invention relates to a method for manufacturing a silicon carbide single crystal, and a silicon carbide substrate.

BACKGROUND ART

In recent years, silicon carbide substrates have been adopted as semiconductor substrates for use in manufacturing semiconductor devices. Silicon carbide has a band gap larger than that of silicon, which has been used more commonly as a material for semiconductor substrates. Hence, a semiconductor device using a silicon carbide substrate advantageously has a large reverse breakdown voltage, low on-resistance, and properties less likely to decrease in a high temperature environment.

In order to efficiently manufacture semiconductor devices, the substrates need to be large in size to some extent. According to U.S. Pat. No. 7,314,520 (Patent Literature 1), a silicon carbide substrate of 76 mm (3 inches) or greater can be manufactured. In the technique described in this specification, a silicon carbide single crystal is grown on a seed crystal by a sublimation method. The seed crystal is required to have a small crystal defect density and a size larger than the size of the silicon carbide substrate to be obtained. However, it is generally difficult to decrease crystal defect density and increase the size of a crystal simultaneously.

Thus, a method using a substrate including a plurality of films each serving as a seed crystal (a seed substrate), instead of using one seed crystal, has been proposed. US Patent Application Publication No. 2004/0187766 (Patent Literature 2) discloses growing a silicon carbide single crystal using a substrate to which a plurality of films are transferred, as a seed substrate.

CITATION LIST

Patent Literature

PTL 1: U.S. Pat. No. 7,314,520
PTL 2: US Patent Application Publication No. 2004/0187766

SUMMARY OF INVENTION

Technical Problem

However, when epitaxial growth is performed on the seed substrate described above, many defects are likely to occur on a boundary portion between the plurality of films transferred onto the seed substrate. Therefore, it is difficult to obtain a single crystal having less defects.

The present invention has been made in view of the above problem, and one object of the present invention is to provide a method for manufacturing a silicon carbide single crystal capable of obtaining a silicon carbide single crystal having less defects, and a silicon carbide substrate made of the single crystal.

Solution to Problem

A method for manufacturing a silicon carbide single crystal in accordance with the present invention has the steps described below.

Firstly, a seed substrate having a supporting portion and first and second material substrates made of silicon carbide having a single-crystal structure is prepared. The first material substrate has a first back surface connected to the supporting portion, a first front surface opposite to the first back surface, and a first side surface connecting the first back surface and the first front surface. The second material substrate has a second back surface connected to the supporting portion, a second front surface opposite to the second back surface, and a second side surface connecting the second back surface and the second front surface. The first and second material substrates are arranged such that the first and second side surfaces face each other with a gap interposed therebetween. The gap has an opening between the first and second front surfaces.

Next, a closing portion for closing the gap over the opening is formed. Then, a connecting portion for closing the opening is provided to the seed substrate by depositing a sublimate of silicon carbide from the first and second side surfaces onto the closing portion. Subsequently, the closing portion is removed. Thereafter, a silicon carbide single crystal that spans over the opening closed by the connecting portion is epitaxially grown on the first and second front surfaces. Then, the seed substrate is removed.

According to the method for manufacturing the silicon carbide single crystal in accordance with the present invention, the connecting portion for closing the opening is formed by sublimation and recrystallization of silicon carbide within the gap in the seed substrate, before the silicon carbide single crystal is grown. The connecting portion has a crystal structure substantially identical to that of the first and second material substrates under the influence of the crystal structure of the first and second material substrates sandwiching the gap. Thereby, a plane including the first and second front surfaces becomes crystallographically substantially uniform, including a boundary portion between the first and second front surfaces, that is, a portion that was the opening. This can suppress occurrence of defects on the boundary portion between the first and second front surfaces when epitaxial growth is performed on the plane including the first and second front surfaces. Thereby, a silicon carbide single crystal having less defects can be obtained.

Preferably, the supporting portion is made of silicon carbide. Thereby, the supporting portion can be made of a material identical to that of the first and second material substrates.

Preferably, the step of preparing the seed substrate includes the step of forming the supporting portion by a sublimation method. Thereby, each of the first and second material substrates can be readily connected to the supporting portion.

Preferably, each of the first and second material substrates has a crystal defect density lower than that of the supporting portion. Thereby, the silicon carbide single crystal formed on the first and second material substrates can have a lowered crystal defect density.

Preferably, the crystal defect density is defined by a micropipe density. Thereby, generation of micropipes which is particularly problematic in epitaxial growth of silicon carbide can be suppressed.

Preferably, the step of epitaxially growing is performed by a sublimation method. Thereby, the silicon carbide single crystal can be manufactured by the sublimation method.

Preferably, each of the silicon carbide single crystal and the first and second material substrates has a crystal structure of a hexagonal system. Thereby, the silicon carbide single crystal can have a crystal structure suitable for manufacturing a semiconductor device, in particular a power semiconductor device.

Each of the first and second front surfaces may have an off angle of not more than 10° from a {0001} plane. Each of the first and second front surfaces may be the {0001} plane. Thereby, occurrence of defects during epitaxial growth of silicon carbide on the first and second front surfaces can be suppressed.

Each of the first and second front surfaces may have an off angle of not less than 80° from a {0001} plane. Thereby, a silicon carbide single crystal having a plane with a high channel mobility such as a {11-20} plane or a {1-100} plane can be grown.

Each of the first and second front surfaces may have an off angle of not less than 50° and not more than 60° from a {0001} plane. Thereby, a silicon carbide single crystal having a plane with a high channel mobility such as a {03-38} plane can be grown.

A silicon carbide substrate in accordance with the present invention is made of the silicon carbide single crystal obtained by the method for manufacturing the silicon carbide single crystal described above. Thereby, a silicon carbide substrate having less defects can be obtained.

Preferably, the silicon carbide substrate has a crystal structure of a hexagonal system. Thereby, the silicon carbide substrate has a crystal structure suitable for manufacturing a semiconductor device, in particular a power semiconductor device and the like.

It is to be noted that, although the first and second material substrates, that is, two material substrates have been described above, this does not mean to exclude a configuration using three or more material substrates.

Advantageous Effects of Invention

According to the method for manufacturing the silicon carbide single crystal in accordance with the present invention, a silicon carbide single crystal having less defects can be obtained as described above.

DESCRIPTION OF EMBODIMENTS

Hereinafter, embodiments of the present invention will be described with reference to the drawings.

First Embodiment

Firstly, a method for manufacturing a silicon carbide single crystal in the present embodiment will be described.

Figure 1:
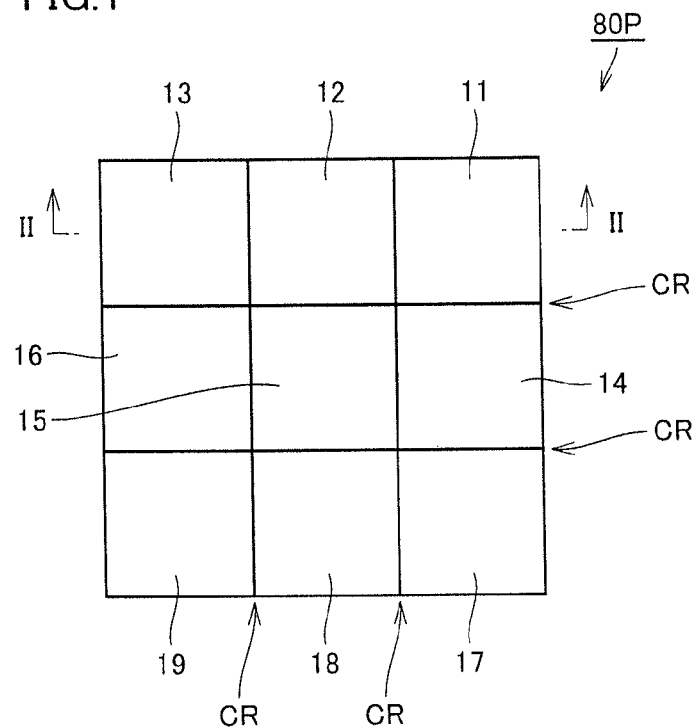
FIG. 1 is a plan view schematically showing a first step of a method for manufacturing a silicon carbide single crystal in a first embodiment of the present invention.
Figure 2:
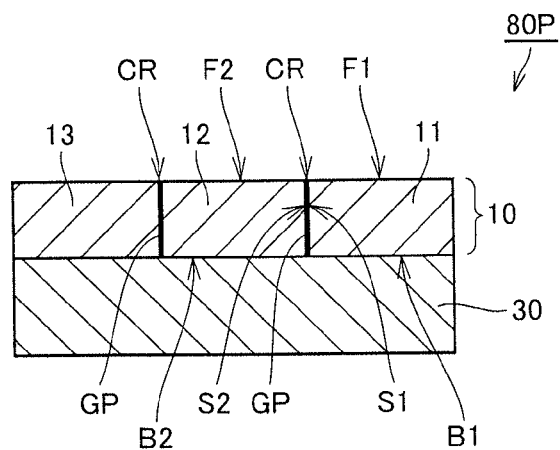
FIG. 2 is a schematic cross sectional view taken along a line II-II in FIG. 1.

Referring to FIGS. 1 and 2, firstly, a seed substrate 80P is prepared. Seed substrate 80P has a material substrate group 10 having material substrates 11 to 19, and a supporting portion 30. Each of material substrates 11 to 19 is made of silicon carbide having a single-crystal structure. Hereinafter, for ease of description, only material substrates 11 and 12 of material substrates 11 to 19 may be explained, but the same explanation also applies to material substrates 13 to 19.

Material substrate 11 (a first material substrate) has a back surface B1 (a first back surface) connected to supporting portion 30, a front surface F1 (a first front surface) opposite to back surface B1, and a side surface S1 (a first side surface) connecting back surface B1 and front surface F1. Material substrate 12 (a second material substrate) has a back surface B2 (a second back surface) connected to supporting portion 30, a front surface F2 (a second front surface) opposite to back surface B2, and a side surface S2 (a second side surface) connecting back surface B2 and front surface F2.

Further, material substrates 11 to 19 are arranged such that side surfaces of adjacent material substrates face each other with a gap interposed therebetween. For example, material substrates 11 and 12 are arranged such that side surfaces S1 and S2 face each other with a gap GP interposed therebetween. Gap GP has an opening CR between front surfaces F1 and F2. It is to be noted that gap GP does not have to completely separate side surface S1 from side surface S2. That is, there may be a part where a portion of side surface S1 and a portion of side surface S2 are in contact with each other.

In the present embodiment, each of material substrates 11 to 19 is made of silicon carbide having a single-crystal structure, and each crystal plane orientation is set to be identical. That is, material substrates 11 to 19 are single crystal substrates having an identical plane orientation, and formed, for example, such that each front surface (i.e., a surface shown in FIG. 1) is a (000-1) plane of polytype 4H.

Preferably, each of material substrates 11 to 19 has a micropipe density of 1000 $cm^{-2}$ or lower, for example, 0.2 $cm^{-2}$. Preferably, each of material substrates 11 to 19 has a stacking fault density of less than 1 $cm^{-1}$. Further, each of material substrates 11 to 19 has, for example, polytype 4H, a length of 30 mm, a width of 30 mm, a thickness of 200 μm, and an n-type impurity concentration of $1 \times 10^{19}$ $cm^{-3}$.

Supporting portion 30 is preferably made of a material that can endure a temperature of 1800° C. or greater, and is made of silicon carbide in the present embodiment.

Further, supporting portion 30 has, for example, a plane orientation of a (000-1) plane of polytype 4H, a micropipe density of $1 \times 10^{4}$ $cm^{-2}$, a stacking fault density of $1 \times 10^{5}$ $cm^{-1}$, a length of 90 mm, a width of 90 mm, a thickness of 2 mm, and an n-type impurity concentration of $1 \times 10^{20}$ $cm^{-3}$.

Figure 3:
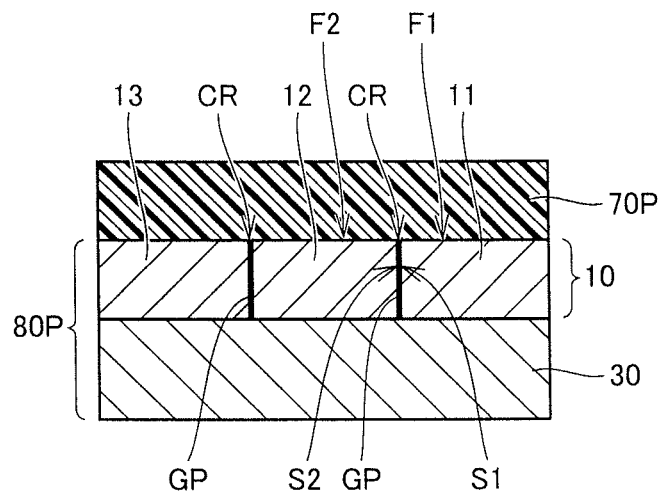
FIG. 3 is a cross sectional view schematically showing a second step of the method for manufacturing the silicon carbide single crystal in the first embodiment of the present invention.

Referring to FIG. 3, onto front surfaces F1 and F2, a resist liquid 70P is applied. Resist liquid 70P is a liquid containing an organic substance, and thus is a fluid containing carbon element. Here, in advance, opening CR is adapted to have a sufficiently small width, and resist liquid 70P is adapted to have a sufficiently high viscosity. Accordingly, resist liquid 70P is applied to close opening CR with little entering gap GP.

Figure 4:
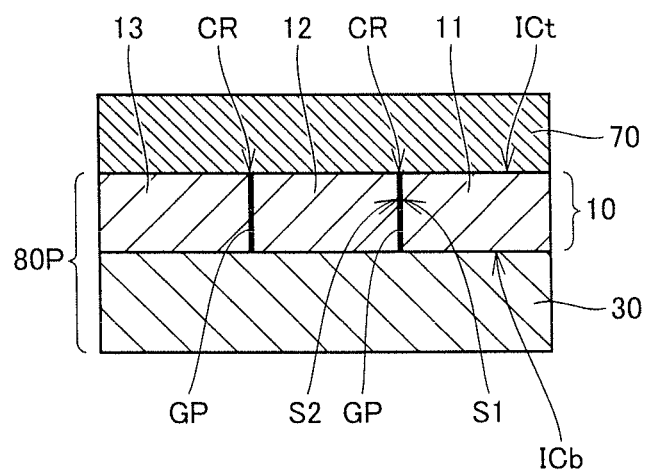
FIG. 4 is a cross sectional view schematically showing a third step of the method for manufacturing the silicon carbide single crystal in the first embodiment of the present invention.

Further, referring to FIG. 4, resist liquid 70P is carbonized, thereby forming a cover 70 (closing portion) made of carbon. This carbonizing step is performed, for example, as follows.

Firstly, resist liquid 70P applied (FIG. 3) is temporarily calcined for 10 seconds to 2 hours at 100 to 300° C. Accordingly, resist liquid 70P is cured to form a resist layer.

Then, this resist layer is thermally treated to be carbonized, thereby forming cover 70 (FIG. 4). The thermal treatment is performed under conditions that the atmosphere is an inert gas or nitrogen gas with a pressure not more than an atmospheric pressure, the temperature is more than 300° C. and less than 1700° C., and the treatment time period is more than one minute and less than 12 hours. If the temperature is not more than 300° C., the carbonization is likely to be insufficient. On the other hand, if the temperature is not less than 1700° C., front surfaces F1 and F2 of material substrates 11 and 12 are likely to be deteriorated. Further, if the treatment time period is not more than one minute, the carbonization of the resist layer is likely to be insufficient. Hence, a longer treatment time period is preferable. However, a sufficient treatment time period is less than 12 hours at maximum.

It is preferable to adjust the thickness of resist liquid 70P (FIG. 3) such that cover 70 will have a thickness of more than 0.1 μm and less than 1 mm. If the thickness thereof is not more than 0.1 μm, cover 70 may be discontinuous over opening CR. On the other hand, if the thickness of cover 70 is not less than 1 mm, it takes a long time to remove cover 70.

Resist liquid 70P is carbonized as described above to form cover 70 that closes gap GP over opening CR.

Figure 5:
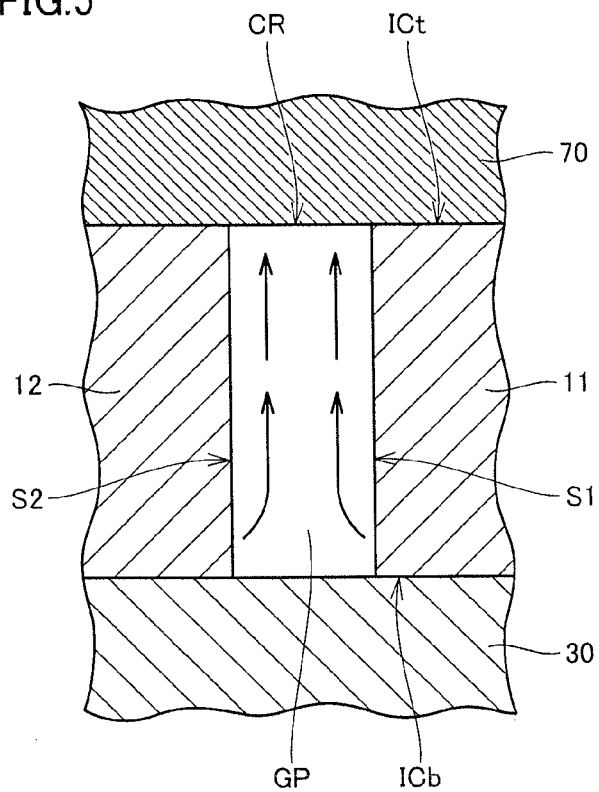
FIG. 5 is a partial cross sectional view schematically showing a fourth step of the method for manufacturing the silicon carbide single crystal in the first embodiment of the present invention.

Further, referring to FIG. 5, seed substrate 80P (FIG. 4) thus having cover 70 formed thereon is heated up to a temperature at which silicon carbide can sublimate. This heating is performed to cause a temperature gradient in a direction of thickness of material substrate group 10 (i.e., a vertical direction in FIG. 5) such that a cover side ICt of material substrate group 10 (FIG. 4), i.e., a side facing cover 70, has a temperature lower than the temperature of a support side ICb of material substrate group 10, i.e., a side facing supporting portion 30. Such a temperature gradient is attained by, for example, heating it to render the temperature of cover 70 lower than that of supporting portion 30.

This heating causes mass transfer as a result of sublimation as indicated by arrows (FIG. 5), from a relatively high temperature region close to support side ICb to a relatively low temperature region close to cover side ICt at the surfaces of material substrates 11 and 12 in gap GP closed by cover 70, i.e., at side surfaces S1 and S2. As a result of the mass transfer, in gap GP, a sublimate from side surfaces S1, S2 is deposited on cover 70. If supporting portion 30 is made of silicon carbide, a sublimate from supporting portion 30 may be further deposited on cover 70.

Figure 6:
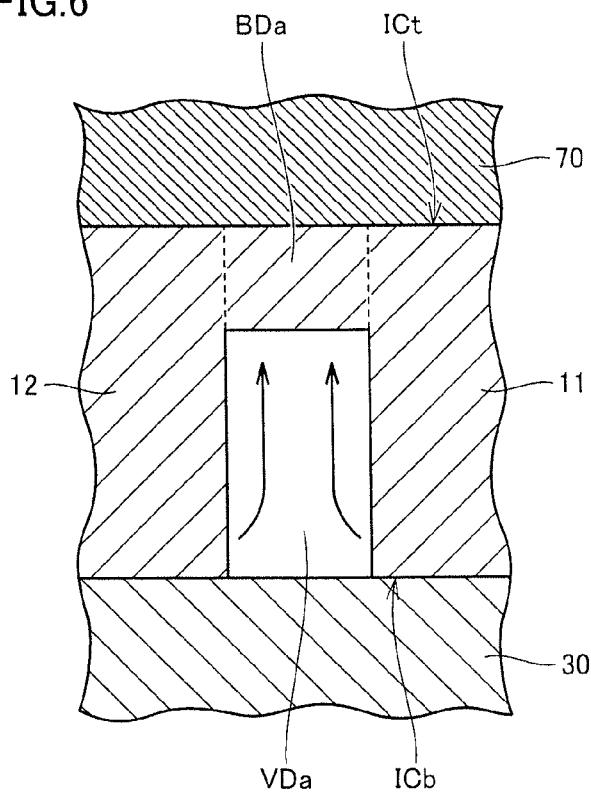
FIG. 6 is a partial cross sectional view schematically showing a fifth step of the method for manufacturing the silicon carbide single crystal in the first embodiment of the present invention.

Further, referring to FIG. 6, as a result of the deposition, a connecting portion BDa is formed to close opening CR of gap GP (FIG. 5) and accordingly connect side surfaces S1 and S2 to each other. As a result, gap GP (FIG. 5) is formed into a gap VDa (FIG. 6) in which opening CR (FIG. 5) is closed by connecting portion BDa. Connecting portion BDa has a crystal structure substantially identical to that of material substrates 11 and 12 under the influence of the crystal structure of material substrates 11 and 12 sandwiching opening CR. For example, if a surface of each of material substrates 11 and 12 facing cover 70 has a plane orientation of (000-1), a surface of connecting portion BDa facing cover 70 also has a plane orientation of (000-1).

It is to be noted that, when an experiment was conducted to review the heating temperatures described above, it was found that at 1600° C., connecting portion BDa was not sufficiently formed, and at 3000° C., the front surfaces of material substrates 11 and 12 were damaged, disadvantageously. These disadvantages were not found at 1800° C., 2000° C., and 2500° C.

In addition, with the heating temperature being fixed to 2000° C., pressures during the heating were reviewed. As a result, at 100 kPa, connecting portion BDa was not formed, and at 50 kPa, connecting portion BDa was less likely to be formed, disadvantageously. These disadvantages were not found at 10 kPa, 100 Pa, 1 Pa, 0.1 Pa, and 0.0001 Pa.

Figure 7:
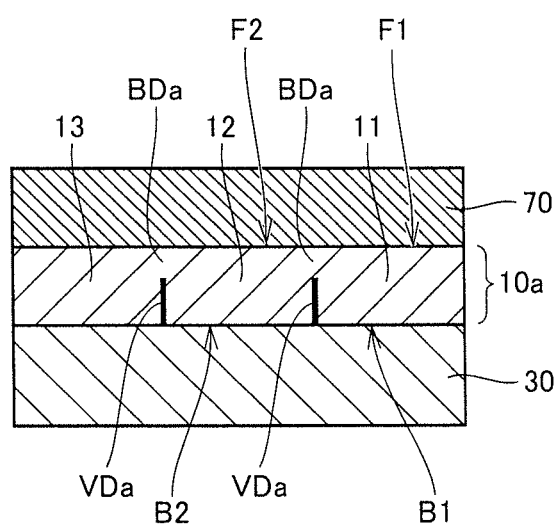
FIG. 7 is a cross sectional view schematically showing a sixth step of the method for manufacturing the silicon carbide single crystal in the first embodiment of the present invention.

Referring to FIG. 7, next, cover 70 is removed. Cover 70 can be removed readily by oxidizing carbon contained in cover 70, i.e., by ashing. It is to be noted that cover 70 may be removed by another method, and may be removed for example by grinding.

If it is assumed that cover 70 is not provided in FIG. 5, since there is no cover 70 for blocking a flow of a sublimated gas (indicated by arrows), the gas is likely to get out of gap GP. As a result, connecting portion BDa (FIG. 6) is less likely to be formed, and thus opening CR is less likely to be closed.

Figure 8:
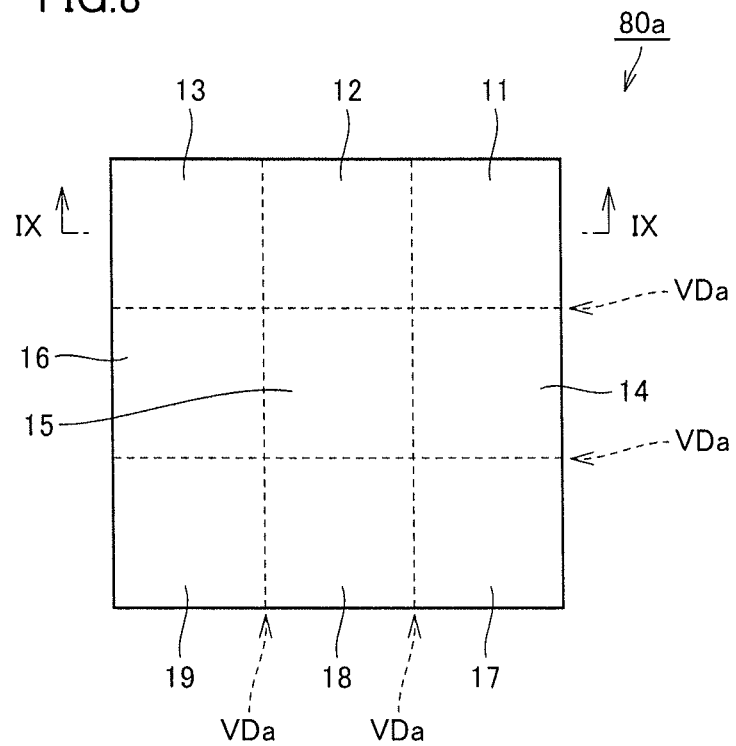
FIG. 8 is a plan view schematically showing a seventh step of the method for manufacturing the silicon carbide single crystal in the first embodiment of the present invention.
Figure 9:
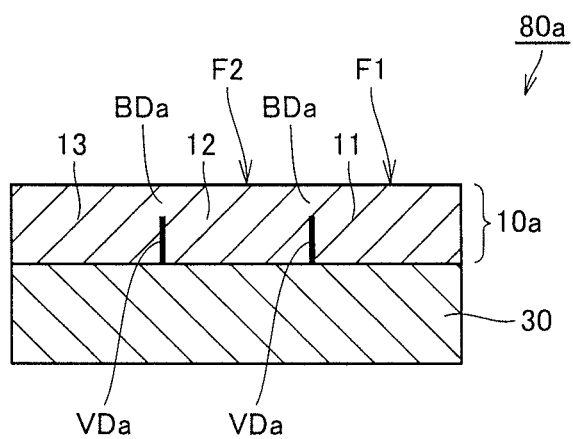
FIG. 9 is a schematic cross sectional view taken along a line IX-IX in FIG. 8.

Referring to FIGS. 8 and 9, through the steps described above, a material substrate group 10a provided with connecting portions BDa (FIGS. 8 and 9) is obtained from material substrate group 10. That is, a seed substrate 80a having material substrate group 10a instead of material substrate group 10 is obtained.

In material substrate group 10a, there are gaps VDa between respective material substrates 11 to 19, and a front surface side (i.e., an upper side in FIG. 9) of each gap VDa is closed by connecting portion BDa. Connecting portion BDa includes a portion located between front surfaces F1 and F2, and thereby front surfaces F1 and F2 are smoothly connected to each other.

Next, polishing may be performed to improve flatness of a back surface of seed substrate 80a (i.e., a lower surface of supporting portion 30 in FIG. 9). Diamond slurry can be used for the polishing. The slurry contains diamond particles with a grain size of, for example, not less than 5 μm and not more than 100 μm, more preferably, not less than 10 μm and not more than 20 μm.

Figure 10:
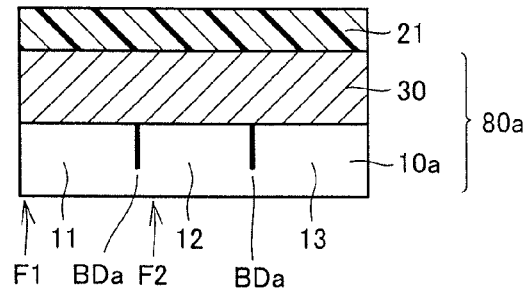
FIG. 10 is a cross sectional view schematically showing an eighth step of the method for manufacturing the silicon carbide single crystal in the first embodiment of the present invention.

Referring to FIG. 10, a coating film 21 containing carbon is formed on the back surface (i.e., an upper surface in the drawing) of seed substrate 80a. Preferably, this formation is performed by applying a liquid material, and more preferably, the liquid material does not contain a solid such as fine particles. Thereby, thin coating film 21 can be formed easily and uniformly.

In the present embodiment, coating film 21 is an organic film. Preferably, the organic film is formed of an organic resin. As the organic resin, for example, an acrylic resin, a phenolic resin, a urea resin, an epoxy resin, or the like can be used, and a resin composed as a photosensitive resin that is cross-linked or decomposed by action of light can also be used. As the photosensitive resin, a positive or negative photoresist used for manufacturing semiconductor devices can be used. Since the technique of applying these materials by spin coating has already been established, the thickness of coating film 21 can be easily controlled. Spin coating is performed, for example, as described below.

Firstly, seed substrate 80a is suctioned onto a holder. Seed substrate 80a is rotated by rotating the holder at a prescribed rotation speed. A photoresist is dropped on rotating seed substrate 80a, and thereafter rotation is continued for a prescribed time period to apply the photoresist thinly and uniformly. To ensure uniformity over an entire surface of seed substrate 80a, for example, the rotation speed is set to 1000 to 10000 rotations/minute, the time period is set to 10 to 100 seconds, and the application thickness is set to not less than 0.1 μm.

Then, the applied photoresist is dried and thereby cured. The drying temperature and the drying time period can be selected as appropriate depending on the material for the photoresist and the application thickness thereof. Preferably, the drying temperature is not less than 100° C. and not more than 400° C., and the drying time period is not less than 5 minutes and not more than 60 minutes. For example, when the drying temperature is 120° C., the time period required for volatilization is, for example, 15 minutes for a thickness of 5 μm, 8 minutes for a thickness of 2 μm, and 3 minutes for a thickness of 1 μm.

It is to be noted that, although coating film 21 can be formed if the step of applying and drying the photoresist described above is performed once, thicker coating film 21 may be formed by repeating this step. Since repeating this step too many times is not preferable as it takes time more than necessary for this step, it is generally preferable to limit the number of repetitions to about two or three.

Figure 11:
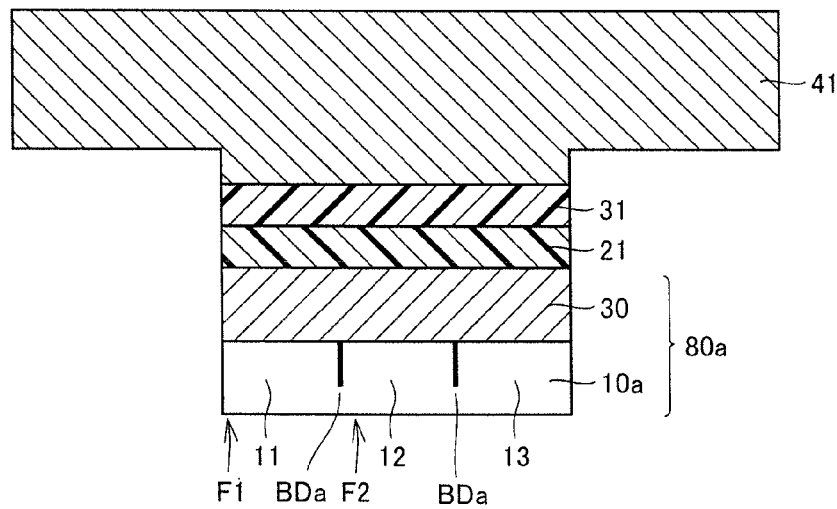
FIG. 11 is a cross sectional view schematically showing a ninth step of the method for manufacturing the silicon carbide single crystal in the first embodiment of the present invention.

Referring to FIG. 11, a pedestal 41 having a mounting surface on which seed substrate 80a is to be mounted is prepared. The mounting surface includes a surface preferably made of carbon. For example, pedestal 41 is formed of graphite. Preferably, the mounting surface is polished to improve flatness of the mounting surface.

Next, coating film 21 and pedestal 41 are brought into contact with each other, with an adhesive 31 interposed therebetween. Preferably, the contact is performed such that the both press against each other at a temperature of not less than 50° C. and not more than 120° C., and under a pressure of not less than 0.01 Pa and not more than 1 MPa. Preferably, adhesive 31 is applied so as not to spread out of a region sandwiched between seed substrate 80a and pedestal 41, and thereby an adverse effect of adhesive 31 in the step of growing a single crystal using seed substrate 80a described later can be suppressed.

Preferably, adhesive 31 includes a resin which will become non-graphitizable carbon by being heated and thereby carbonized, heat-resistant fine particles, and a solvent. More preferably, adhesive 31 further includes a carbohydrate.

The resin which will become non-graphitizable carbon is, for example, a novolak resin, a phenol resin, or a furfuryl alcohol resin.

The heat-resistant fine particles have a function of uniformly distributing the non-graphitizable carbon described above in a fixing layer formed by heating adhesive 31 to a high temperature, and thereby increasing the filling rate of the fixing layer. As a material for the heat-resistant fine particles, a heat-resistant material such as carbon (C) including graphite, silicon carbide (SiC), boron nitride (BN), and aluminum nitride (AlN) can be used. In addition, a high melting point metal, or a compound such as a carbide or nitride thereof can also be used as a material other than those described above. As the high melting point metal, for example, tungsten (W), tantalum (Ta), molybdenum (Mo), titanium (Ti), zirconium (Zr), or hafnium (Hf) can be used. The heat-resistant fine particles have a grain size of, for example, 0.1 to 10 μm.

As the carbohydrate, a saccharide or a derivative thereof can be used. The saccharide may be a monosaccharide such as glucose, or a polysaccharide such as cellulose.

As the solvent, a solvent that can dissolve and disperse the resin and the carbohydrate described above is selected as appropriate. Further, the solvent is not limited to a solvent composed of a single type of liquid, and may be a mixed liquid containing plural types of liquids. For example, a solvent including alcohol for dissolving the carbohydrate and cellosolve acetate for dissolving the resin may be used.

The ratio among the resin, the carbohydrate, the heat-resistant fine particles, and the solvent in adhesive 31 is selected as appropriate to obtain suitable adhesion and fixing strength of seed substrate 80a. In addition, the components of adhesive 31 may include a component other than those described above, and may include, for example, an additive such as a surfactant, a stabilizer, and the like. Further, the application amount of adhesive 31 is preferably not less than 10 mg/cm$^2$ and not more than 100 mg/cm$^2$. Furthermore, the thickness of adhesive 31 is preferably not more than 100 μm, and more preferably not more than 50 μm.

Next, preferably, adhesive 31 is prebaked. Preferably, the prebaking is performed at a temperature of not less than 150° C.

Figure 12:
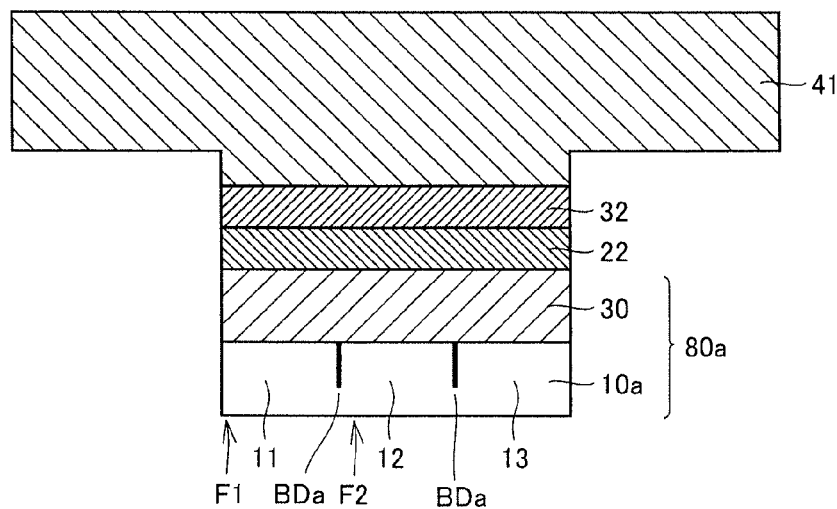
FIG. 12 is a cross sectional view schematically showing a tenth step of the method for manufacturing the silicon carbide single crystal in the first embodiment of the present invention.

Further, referring to FIG. 12, coating film 21 and adhesive 31 (FIG. 11) are heated. As a result of the heating, coating film 21 is carbonized and becomes a carbon film 22. That is, carbon film 22 is provided on seed substrate 80a. Further, as a result of the heating, adhesive 31 is cured between carbon film 22 and pedestal 41, and becomes a fixing layer 32. Thereby, seed substrate 80a is fixed to pedestal 41.

Preferably, the heating described above is performed at a temperature of not less than 800° C. and not more than 1800° C., for a time period of not less than one hour and not more than 10 hours, under a pressure of not less than 0.13 kPa and not more than the atmospheric pressure, and in an inactive gas atmosphere. As an inactive gas, for example, helium, argon, or nitrogen gas is used.

Figure 13:
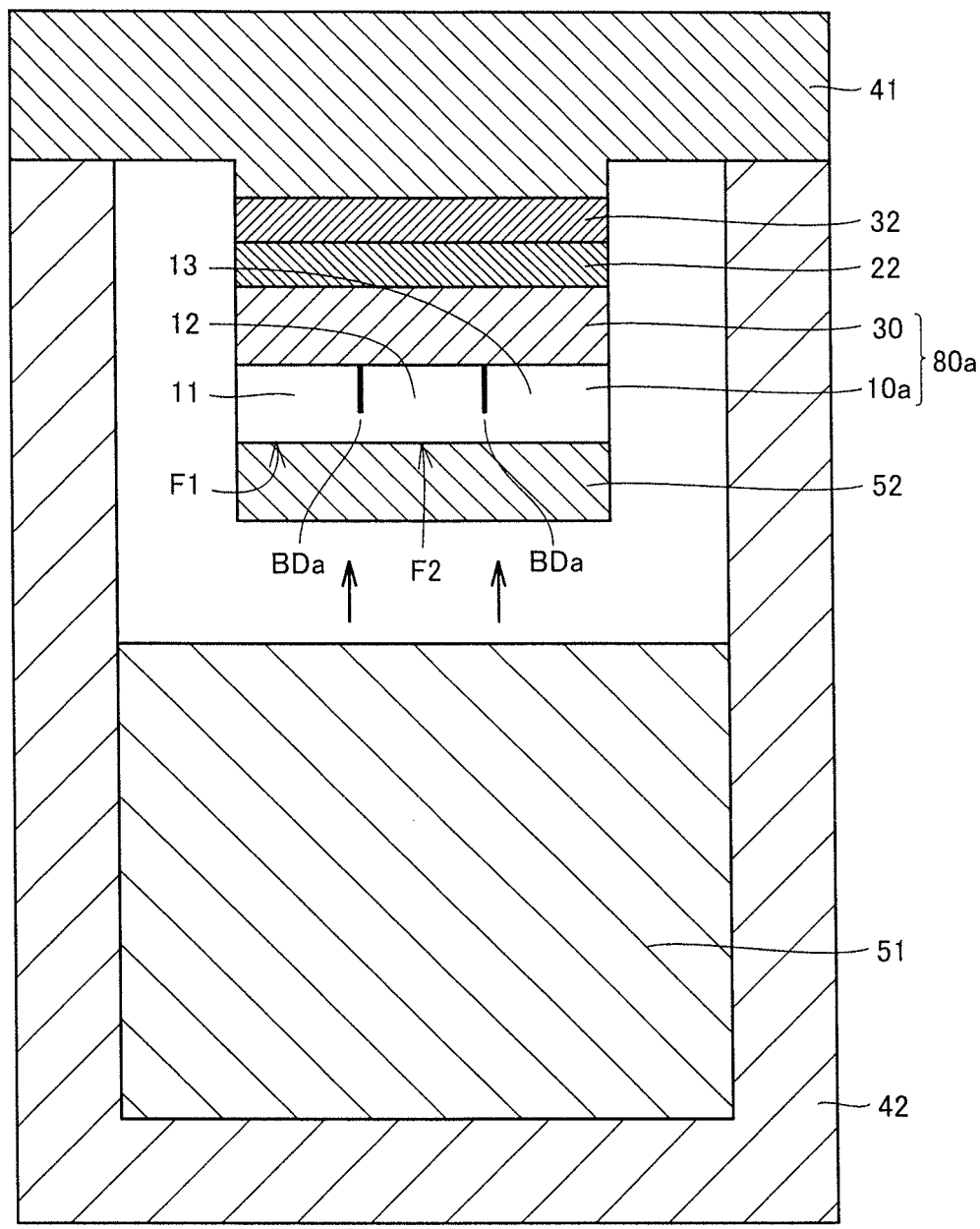
FIG. 13 is a cross sectional view schematically showing an eleventh step of the method for manufacturing the silicon carbide single crystal in the first embodiment of the present invention.

Referring to FIG. 13, a source material 51 for forming a silicon carbide single crystal by a sublimation method is placed inside a crucible 42. For example, crucible 42 is a graphite crucible, and source material 51 is silicon carbide powder. Then, pedestal 41 is mounted such that seed substrate 80a faces the inside of crucible 42. It is to be noted that pedestal 41 may function as a cover for crucible 42 as shown in FIG. 13.

Subsequently, a silicon carbide single crystal 52 is grown on seed substrate 80a by the sublimation method. Specifically, silicon carbide single crystal 52 is epitaxially grown on front surfaces F1 and F2 by sublimating source material 51 as indicated by arrows in the drawing, and further recrystallizing the sublimated gas. Silicon carbide single crystal 52 is formed to span over connecting portions BDa. The temperature in the sublimation method is set to, for example, not less than 2100° C. and not more than 2500° C. Further, the pressure in the sublimation method is preferably set to, for example, not less than 1.3 kPa and not more than the atmospheric pressure, and more preferably set to not more than 13 kPa to increase a growth rate. In addition, the thickness of silicon carbide single crystal 52 is preferably set to not less than 1 μm.

Figure 14:
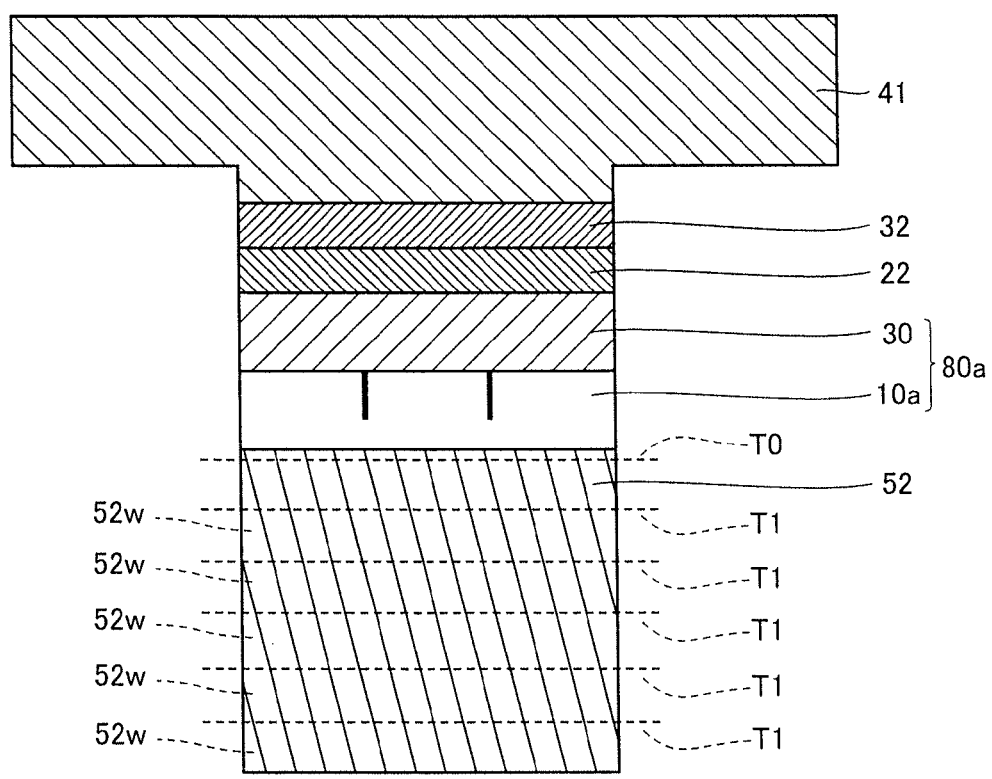
FIG. 14 is a cross sectional view schematically showing a twelfth step of the method for manufacturing the silicon carbide single crystal in the first embodiment of the present invention.

Further, referring to FIG. 14, pedestal 41 is taken out from crucible 42 (FIG. 13). Next, seed substrate 80a is removed by slicing silicon carbide single crystal 52 as indicated by a dashed line T0. Thereby, silicon carbide single crystal 52 is obtained. Further, silicon carbide substrates 52w may be produced from silicon carbide single crystal 52 by slicing silicon carbide single crystal 52 as indicated by dashed lines T1.

Figure 15:
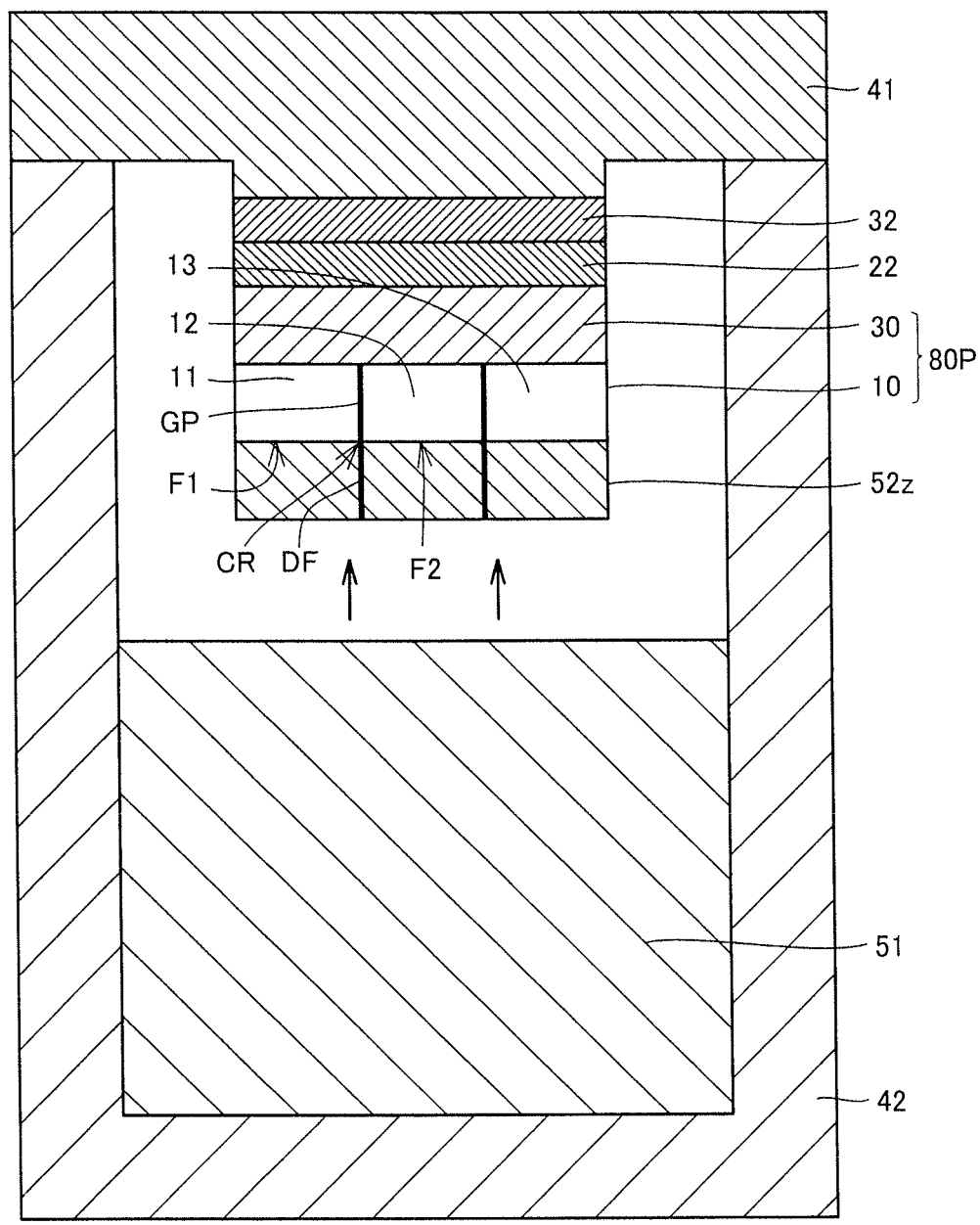
FIG. 15 is a partial cross sectional view showing one step of a method for manufacturing a silicon carbide single crystal in a comparative example.

Next, a comparative example (FIG. 15) will be described. In the present comparative example, a silicon carbide single crystal is epitaxially grown using seed substrate 80P (FIGS. 1 and 2) instead of seed substrate 80a (FIGS. 8 and 9). Since seed substrate 80P has openings CR that are not closed, many defects occur over opening CR during the epitaxial growth. Thus, an obtained silicon carbide single crystal 52z has a high crystal defect density.

In contrast, according to the present embodiment, connecting portion BDa (FIG. 6) for closing opening CR is formed by sublimation and recrystallization of silicon carbide within gap GP (FIG. 5), before silicon carbide single crystal 52 (FIG. 13) is grown. That is, seed substrate 80a (FIGS. 8 and 9) having connecting portions BDa is formed from seed substrate 80P (FIGS. 1 and 2). Connecting portion BDa has a crystal structure substantially identical to that of material substrates 11 and 12 under the influence of the crystal structure of material substrates 11 and 12 sandwiching gap GP. Thereby, a plane including front surfaces F1 and F2 becomes crystallographically substantially uniform, including a boundary portion between front surfaces F1 and F2, that is, a portion that was opening CR. This can suppress occurrence of defects on the boundary portion between front surfaces F1 and F2 when silicon carbide single crystal 52 (FIG. 13) is epitaxially grown on the plane including front surfaces F1 and F2. Thereby, silicon carbide single crystal 52 having less defects can be obtained.

Further, since cover 70 is made of carbon, cover 70 can be provided with a heat resistance enough to endure a high temperature during the formation of connecting portion BDa (FIG. 6).

Furthermore, cover 70 can be formed by application (FIG. 3) and carbonization (FIG. 4) of resist liquid 70P, which are easily performed. In addition, since resist liquid 70P is a liquid, an application method can be used to form cover 70.

Further, carbon film 22 (FIG. 12) is provided on seed substrate 80a, and fixing layer 32 fixes carbon film 22 to pedestal 41. That is, fixing layer 32 is connected to carbon film 22, not to seed substrate 80a. Thereby, bonding is performed without directly depending on the material for seed substrate 80a, and thus seed substrate 80a and pedestal 41 can be fixed more firmly. In particular, when pedestal 41 is formed of carbon such as graphite, carbon film 22 can be firmly bonded to pedestal 41 using the carbon-based adhesive as they are both formed of carbon.

Although coating film 21 is carbonized when adhesive 31 is cured in the present embodiment, coating film 21 may be carbonized before adhesive 31 is formed.

Further, each of front surfaces F1 and F2 may have an off angle of not more than 10° from a {0001} plane. Each of front surfaces F1 and F2 may be the {0001} plane. Thereby, occurrence of defects during epitaxial growth of silicon carbide on front surfaces F1 and F2 can be suppressed.

Alternatively, each of front surfaces F1 and F2 may have an off angle of not less than 80° from the {0001} plane. Thereby, silicon carbide single crystal 52 suitable for cutting out silicon carbide substrate 52w having a plane with a high channel mobility such as a {11-20} plane or a {1-100} plane can be grown.

Alternatively, each of front surfaces F1 and F2 may have an off angle of not less than 50° and not more than 60° from the {0001} plane. Thereby, silicon carbide single crystal 52 suitable for cutting out silicon carbide substrate 52w having a plane with a high channel mobility such as a {03-38} plane can be grown.

Next, a variation of the present embodiment will be described. In the present variation, instead of resist liquid 70P (FIG. 3), an adhesive is used as the fluid applied to form cover 70 (FIG. 4). This adhesive is a suspension containing carbon powder (carbon adhesive).

The carbon adhesive applied is temporarily calcined at 50° C. to 400° C. for 10 seconds to 12 hours. Accordingly, the carbon adhesive is cured to form an adhesive layer.

Then, this adhesive layer is thermally treated to be carbonized, thereby forming cover 70. The thermal treatment is performed under conditions that the atmosphere is an inert gas or nitrogen gas with a pressure not more than the atmospheric pressure, the temperature is more than 300° C. and less than 2500° C., and the treatment time period is more than one minute and less than 12 hours. If the temperature is not more than 300° C., the carbonization is likely to be insufficient. On the other hand, if the temperature is not less than 2500° C., the front surfaces of material substrates 11 and 12 are likely to be deteriorated. Further, if the treatment time period is not more than one minute, the carbonization of the adhesive layer is likely to be insufficient. Hence, a longer treatment time period is preferable. However, a sufficient treatment time period is less than 12 hours at maximum. Thereafter, steps similar to the above-described steps in the present embodiment are performed.

According to the present variation, since cover 70 is formed of the suspension containing carbon powder, cover 70 can be carbonized more securely. In other words, the material for cover 70 can be formed into carbon more securely.

Second Embodiment

In a method for manufacturing a silicon carbide single crystal in the present embodiment, firstly, seed substrate 80P (FIGS. 1 and 2) is prepared as in the first embodiment.

Figure 16:
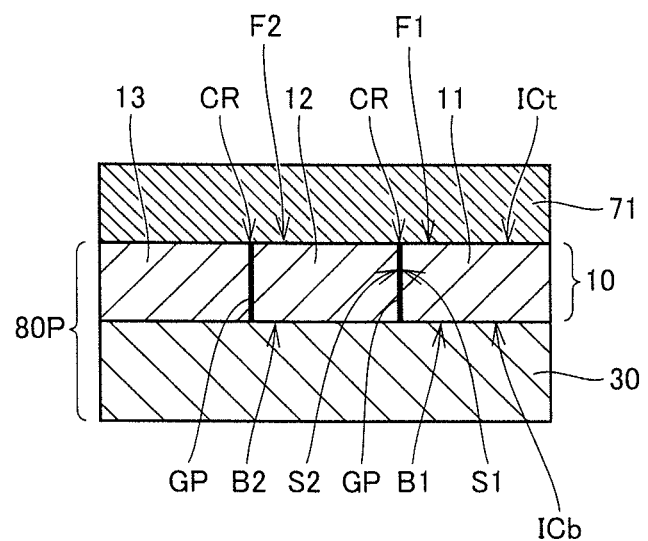
FIG. 16 is a cross sectional view schematically showing a first step of a method for manufacturing a silicon carbide single crystal in a second embodiment of the present invention.

Referring to FIG. 16 mainly, carbon is deposited by means of a sputtering method, and accordingly, a cover 71 (closing portion) is formed instead of cover 70 (FIG. 4).

Cover 71 preferably has a thickness of more than 0.1 μm and less than 1 mm. If the thickness thereof is not more than 0.1 μm, cover 71 may be discontinuous over opening CR. On the other hand, if cover 71 has a thickness of not less than 1 mm, it takes a long time to remove cover 71.

Figure 17:
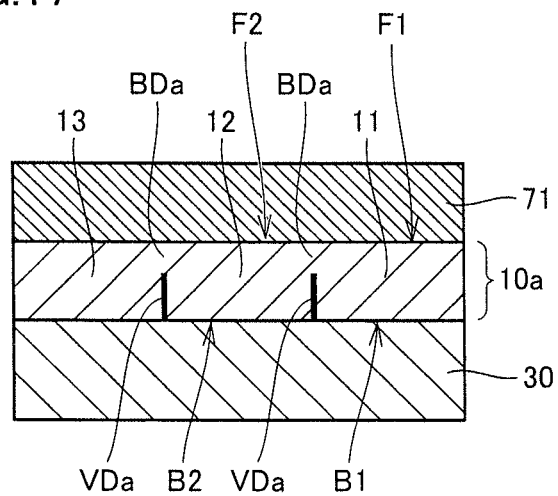
FIG. 17 is a cross sectional view schematically showing a second step of the method for manufacturing the silicon carbide single crystal in the second embodiment of the present invention.

Further, referring to FIG. 17, through steps similar to those in the first embodiment (FIGS. 5 and 6), gap GP is formed into gap VDa closed by connecting portion BDa. Next, cover 71 is removed, thus obtaining seed substrate 80a (FIGS. 8 and 9).

Next, by performing steps similar to those in the first embodiment (FIGS. 10 to 14), silicon carbide single crystal 52 and silicon carbide substrate 52w are obtained.

According to the present embodiment, cover 71 originally made of carbon is formed without carbonization. Hence, the material for cover 71 can be formed into carbon more securely.

Further, cover 71 is formed by depositing the substance onto front surfaces F1 and F2 (FIG. 16). Hence, cover 71 is securely in contact with each of front surfaces F1 and F2. Accordingly, opening CR between front surfaces F1 and F2 can be closed more securely.

Next, a first variation of the present embodiment will be described. In the present variation, as cover 71 (FIG. 16), a carbon plate prepared in advance is arranged on front surfaces F1 and F2 to span over opening CR. According to the present variation, the step of providing cover 71 and the step of removing cover 71 after forming connecting portion BDa (FIG. 17) can be performed readily.

Subsequently, a second variation of the present embodiment will be described. In the present variation, instead of arranging the carbon plate as described above, a metal plate made of a high melting point metal is arranged. As the high melting point metal, a metal having a melting point of 1800° C. or greater is preferable. An exemplary high melting point metal usable is molybdenum, tantalum, tungsten, niobium, iridium, ruthenium, or zirconium. According to the present variation, since cover 71 is made of a high melting point metal, cover 71 can be provided with a heat resistance enough to endure the high temperature during the formation of connecting portion BDa.

It is to be noted that, in the first and second variations, instead of preparing seed substrate 80P, supporting portion 30 and material substrates 11 and 12 not connected to supporting portion 30 may be prepared. In this case, at the same time as the formation of connecting portion BDa at the high temperature, each of back surfaces B1 and B2 is connected to supporting portion 30.

Next, a third variation of the present embodiment will be described. In the present variation, instead of depositing carbon as described above, silicon carbide is deposited. As a deposition method, the CVD method can be used, for example. According to the present variation, since cover 71 is made of silicon carbide, cover 71 can be provided with a heat resistance enough to endure the high temperature during the formation of connecting portion BDa.

Subsequently, a fourth variation of the present embodiment will be described. In the present variation, instead of depositing carbon as described above, a high melting point metal similar to that of the third variation is deposited. As a deposition method, the sputtering method can be used, for example.

Third Embodiment

In the present embodiment, a method for manufacturing seed substrate 80P (FIGS. 1 and 2) used in the first or second embodiment will be described in detail. Hereinafter, for ease of description, only material substrates 11 and 12 of material substrates 11 to 19 may be explained, but the same explanation also applies to material substrates 13 to 19.

Figure 18:
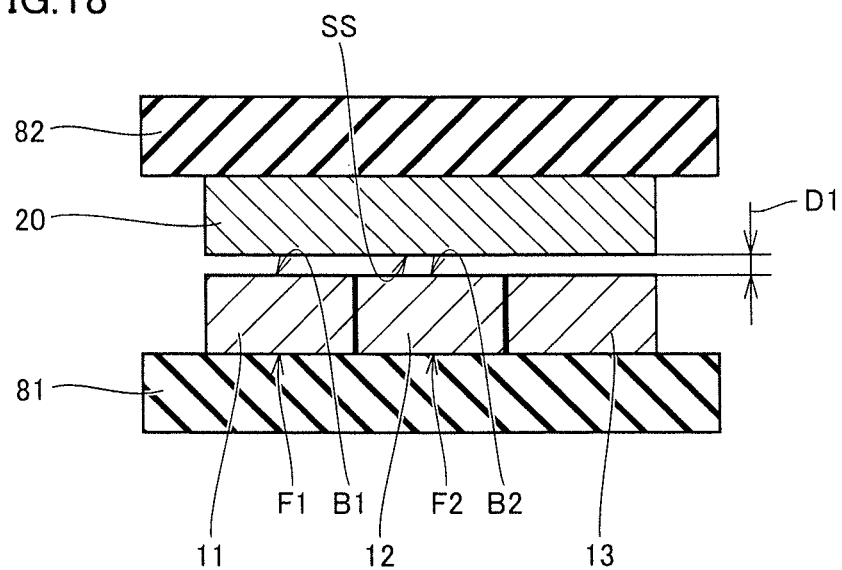
FIG. 18 is a cross sectional view schematically showing a first step of a method for manufacturing a silicon carbide single crystal in a third embodiment of the present invention.

Referring to FIG. 18, material substrates 11 and 12 made of silicon carbide having a single-crystal structure are prepared. Specifically, for example, each of material substrates 11 and 12 is prepared by slicing a polytype 4H silicon carbide ingot grown in the (000-1) plane, along the (000-1) plane.

Preferably, back surfaces B1 and B2 have a roughness Ra of not more than 100 μm. Each of back surfaces B1 and B2 may be a surface formed by the above-described slicing (so-called "as-sliced surface"), i.e., a surface not polished after the slicing. In this case, moderate irregularities can be left in back surfaces B1 and B2.

Next, material substrates 11 and 12 are arranged on a first heating member 81 in a processing chamber with each of back surfaces B1 and B2 being exposed in one direction (upward in FIG. 18). That is, when viewed in a plan view, material substrates 11 and 12 are arranged side by side.

Preferably, the above arrangement is accomplished by disposing back surfaces B1 and B2 on the same flat plane or by disposing front surfaces F1 and F2 on the same flat plane.

Further, a minimum space between material substrates 11 and 12 (minimum space in a lateral direction in FIG. 18) is preferably 5 mm or smaller, more preferably 1 mm or smaller, further preferably 100 μm or smaller, and still further preferably 10 μm or smaller. Specifically, for example, the substrates, which have the same rectangular shape, may be arranged in the form of a matrix with a space of 1 mm or smaller therebetween.

Next, supporting portion 30 (FIG. 2) is formed to connect back surfaces B1 and B2 to each other. For the step of forming supporting portion 30, a sublimation method, preferably, a close-spaced sublimation method is used. Hereinafter, the step of forming supporting portion 30 will be described in detail.

Firstly, each of back surfaces B1 and B2 exposed in the one direction (upward in FIG. 18) and a surface SS of a solid source material 20 arranged in the one direction (upward in FIG. 18) relative to back surfaces B1 and B2 are disposed to face each other with a space D1 provided therebetween. Preferably, space D1 has an average value smaller than a mean free path for a sublimation gas in the sublimation method, and set to, for example, not less than 1 μm and not more than 1 cm. This sublimation gas is a gas formed by sublimation of solid SiC, and includes Si, $Si_2C$, and $SiC_2$, for example.

Solid source material 20 is made of silicon carbide, and is preferably a piece of solid matter of silicon carbide, specifically, a silicon carbide wafer, for example. Solid source material 20 is not particularly limited in the crystal structure of silicon carbide. Further, surface SS of solid source material 20 preferably has a roughness Ra of not more than 1 mm.

Figure 21:
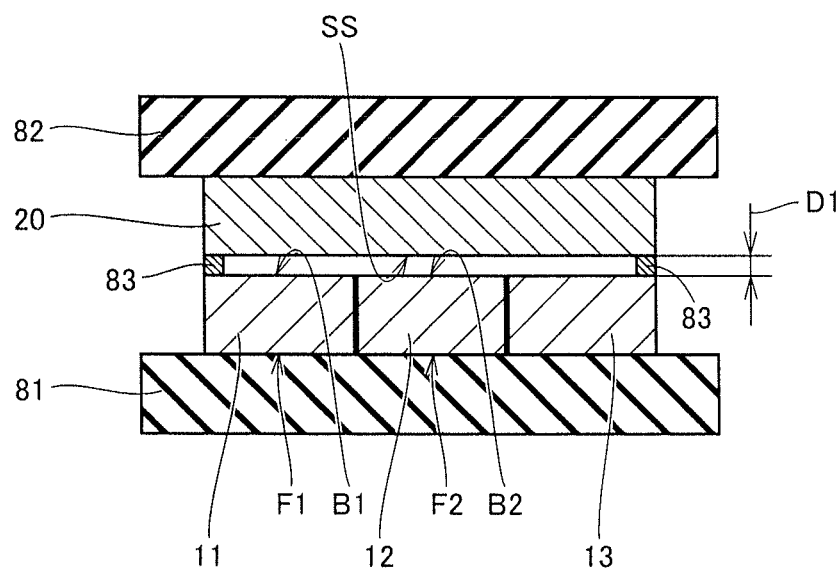
FIG. 21 is a cross sectional view schematically showing one step of a method for manufacturing a silicon carbide single crystal in a first variation of the third embodiment of the present invention.

In order to provide space D1 (FIG. 18) more securely, there may be used spacers 83 (FIG. 21) each having a height corresponding to space D1. This method is particularly effective when the average value of space D1 is approximately 100 μm or greater.

Next, material substrates 11 and 12 are heated by the first heating member 81 to a predetermined substrate temperature. On the other hand, solid source material 20 is heated by a second heating member 82 to a predetermined source material temperature. When solid source material 20 is thus heated to the source material temperature, silicon carbide is sublimated at surface SS of the solid source material to generate a sublimate, i.e., gas. The gas is supplied onto each of back surfaces B1 and B2 from the one direction (from above in FIG. 18).

Preferably, the substrate temperature is set lower than the source material temperature, and is more preferably set so that a difference between the temperatures is not less than 1° C. and not more than 100° C. Further, the substrate temperature is preferably not less than 1800° C. and not more than 2500° C.

Figure 19:
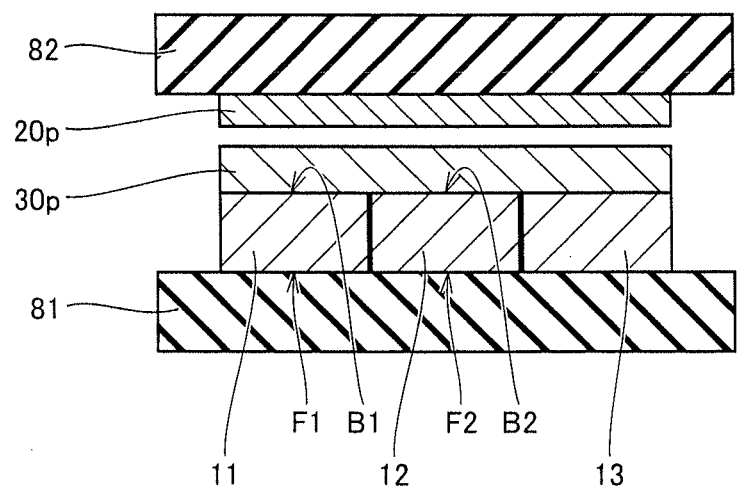
FIG. 19 is a cross sectional view schematically showing a second step of the method for manufacturing the silicon carbide single crystal in the third embodiment of the present invention.

Referring to FIG. 19, the gas supplied as described above is solidified and accordingly recrystallized on each of back surfaces B1 and B2. In this way, a supporting portion 30p is formed to connect back surfaces B1 and B2 to each other. Further, solid source material 20 (FIG. 18) is consumed and is reduced in size to be a solid source material 20p.

Figure 20:
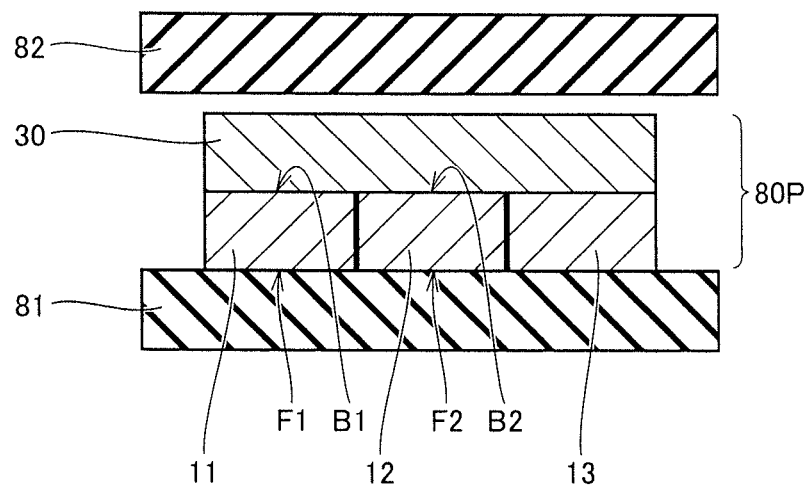
FIG. 20 is a cross sectional view schematically showing a third step of the method for manufacturing the silicon carbide single crystal in the third embodiment of the present invention.

Referring to FIG. 20 mainly, as the sublimation further develops, solid source material 20p (FIG. 19) is run out. In this way, supporting portion 30 is formed to connect back surfaces B1 and B2 to each other.

Thereby, seed substrate 80P is obtained. Using seed substrate 80P, a silicon carbide single crystal can be manufactured, for example, by the method in accordance with the first or second embodiment.

It is to be noted that, during the formation of supporting portion 30, the atmosphere in the processing chamber may be obtained by reducing the pressure of atmospheric air. Preferably, in this case, the pressure of the atmosphere is set to higher than $10^{-1}$ Pa and lower than $10^4$ Pa.

The atmosphere described above may be an inert gas. An exemplary inert gas usable is a noble gas such as He or Ar; nitrogen gas; or a mixed gas of a noble gas and nitrogen gas. When using the mixed gas, the nitrogen gas has a ratio of, for example, 60%. Further, the pressure in the processing chamber is set to preferably 50 kPa or lower, and more preferably 10 kPa or lower.

Further, supporting portion 30 preferably has a single-crystal structure. More preferably, supporting portion 30 on back surface B1 has a crystal plane inclined by 10° or smaller relative to the crystal plane of back surface B1, or supporting portion 30 on back surface B2 has a crystal plane inclined by 10° or smaller relative to the crystal plane of back surface B2. These angular relations can be readily realized by epitaxially growing supporting portion 30 on each of back surfaces B1 and B2.

The crystal polytype of material substrates 11 and 12 is, for example, 4H, 6H, 15R, or 3C, and is particularly preferably 4H or 6H. Moreover, it is preferable that material substrates 11, 12 and supporting portion 30 are made of silicon carbide single crystals having the same crystal structure.

When the material substrates (material substrates 11, 12, and the like) and supporting portion 30 are made of silicon carbide single crystals having the same crystal structure, there may be a difference in crystallographic properties therebetween. Examples of such properties include crystal defect density, crystal quality, and impurity concentration. Hereinafter, this will be described.

Supporting portion 30 may have a crystal defect density higher than those of material substrates 11 to 19. Hence, supporting portion 30 can be formed readily irrespective of its size being larger than the size of each of material substrates 11 to 19. Specifically, supporting portion 30 may have a micropipe density higher than those of material substrates 11 to 19. Further, supporting portion 30 may have a threading screw dislocation density higher than those of material substrates 11 to 19. Further, supporting portion 30 may have a threading edge dislocation density higher than those of material substrates 11 to 19. Further, supporting portion 30 may have a basal plane dislocation density higher than those of material substrates 11 to 19. Further, supporting portion 30 may have a composite dislocation density higher than those of material substrates 11 to 19. Further, supporting portion 30 may have a stacking fault density higher than those of material substrates 11 to 19. Further, supporting portion 30 may have a point defect density higher than those of material substrates 11 to 19.

Further, the quality of the crystal of supporting portion 30 may be lower than those of the crystals of material substrates 11 to 19. Hence, supporting portion 30 can be formed readily irrespective of its size being larger than the size of each of material substrates 11 to 19. Specifically, supporting portion 30 may have a half width in an X-ray rocking curve larger than those of material substrates 11 to 19.

According to the present embodiment, as shown in FIG. 2, material substrates 11 and 12 are combined as one seed substrate 80P through supporting portion 30. Seed substrate 80P includes respective front surfaces F1 and F2 of material substrates 11 and 12, as a growth surface on which silicon carbide single crystal 52 (FIG. 13) is to be grown. In other words, seed substrate 80P has a growth surface larger than that in the case where any of material substrates 11 and 12 is solely used. Thus, larger silicon carbide single crystal 52 can be formed by using seed substrate 80P.

Further, since supporting portion 30 formed on each of back surfaces B1 and B2 is also made of silicon carbide as with material substrates 11 and 12, physical properties of each of material substrates 11 and 12 and supporting portion 30 are close to one another. Accordingly, warpage or cracks of seed substrate 80P resulting from a difference in physical properties therebetween can be suppressed.

Furthermore, utilization of the sublimation method allows supporting portion 30 to be formed fast with high quality.

When the sublimation method thus utilized is a close-spaced sublimation method, supporting portion 30 can be formed more uniformly.

Further, when the average value of space D1 (FIG. 18) between each of back surfaces B1 and B2 and the surface of solid source material 20 is set to 1 cm or smaller, distribution in film thickness of supporting portion 30 can be reduced. Furthermore, when the average value of space D1 is set to 1 mm or smaller, the distribution in film thickness of supporting portion 30 can be further reduced. In addition, when the average value of space D1 is set to 1 μm or greater, a space for sublimation of silicon carbide can be sufficiently secured.

Moreover, in the step of forming supporting portion 30 (FIGS. 18 to 20), the temperatures of material substrates 11 and 12 are set lower than that of solid source material 20 (FIG. 18). This allows the sublimated silicon carbide to be efficiently solidified on material substrates 11 and 12.

Further, the step of arranging material substrates 11 and 12 is preferably performed to allow the minimum space between material substrates 11 and 12 to be 1 mm or smaller. Accordingly, supporting portion 30 can be formed to connect back surface B1 of material substrate 11 and back surface B2 of material substrate 12 to each other more securely.

Further, supporting portion 30 preferably has a single-crystal structure. Accordingly, supporting portion 30 has physical properties close to the physical properties of each of material substrates 11 and 12 having a single-crystal structure.

More preferably, supporting portion 30 on back surface B1 has a crystal plane inclined by 10° or smaller relative to the crystal plane of back surface B1. Further, supporting portion 30 on back surface B2 has a crystal plane inclined by 10° or smaller relative to the crystal plane of back surface B2. Accordingly, supporting portion 30 can have anisotropy close to that of each of material substrates 11 and 12.

In the description above, the silicon carbide wafer is exemplified as solid source material 20, but solid source material 20 is not limited thereto, and may be silicon carbide powder or a silicon carbide sintered compact, for example.

Further, as the first and second heating members 81, 82, any heating members can be used as long as they are capable of heating a target object. For example, the heating members can be of resistive heating type employing a graphite heater, or of inductive heating type.

Furthermore, in FIG. 18, the space is provided between each of back surfaces B1 and B2 and surface SS of solid source material 20 to extend therealong entirely. However, in the present specification, the expression "space is provided" has a broader meaning to indicate that the space has an average value of more than zero. Hence, the expression may encompass a case where a space is provided between each of back surfaces B1 and B2 and surface SS of solid source material 20 while back surfaces B1 and B2 and surface SS of solid source material 20 are partially in contact with each other. Two variations corresponding to this case will be described below.

Figure 22:
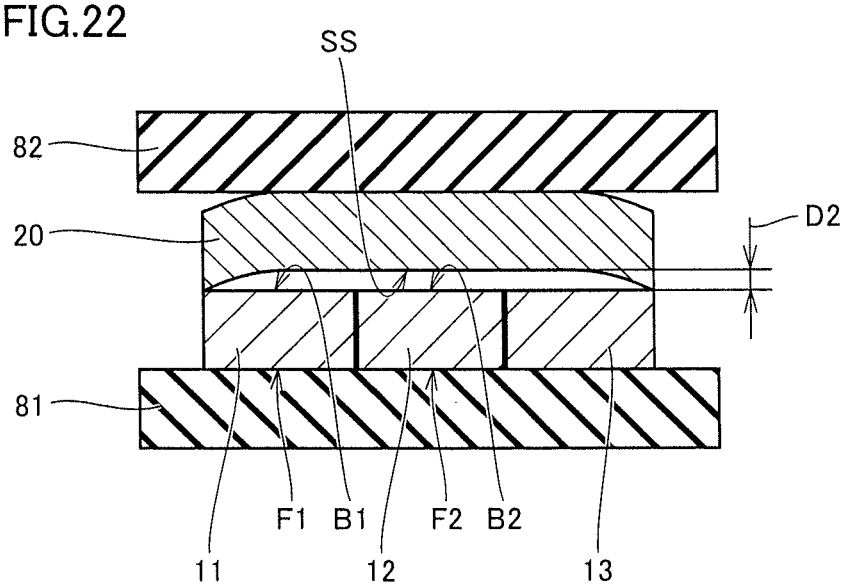
FIG. 22 is a cross sectional view schematically showing one step of a method for manufacturing a silicon carbide single crystal in a second variation of the third embodiment of the present invention.

Referring to FIG. 22, in a variation thereof, the space is secured by warpage of the silicon carbide wafer serving as solid source material 20. More specifically, in the present variation, there is provided a space D2 that is locally zero but surely has an average value exceeding zero. Further, preferably, as with the average value of space D1, the average value of space D2 is set to be smaller than the mean free path for the sublimation gas in the sublimation method. For example, the average value is set to not less than 1 μm and not more than 1 cm.

Figure 23:
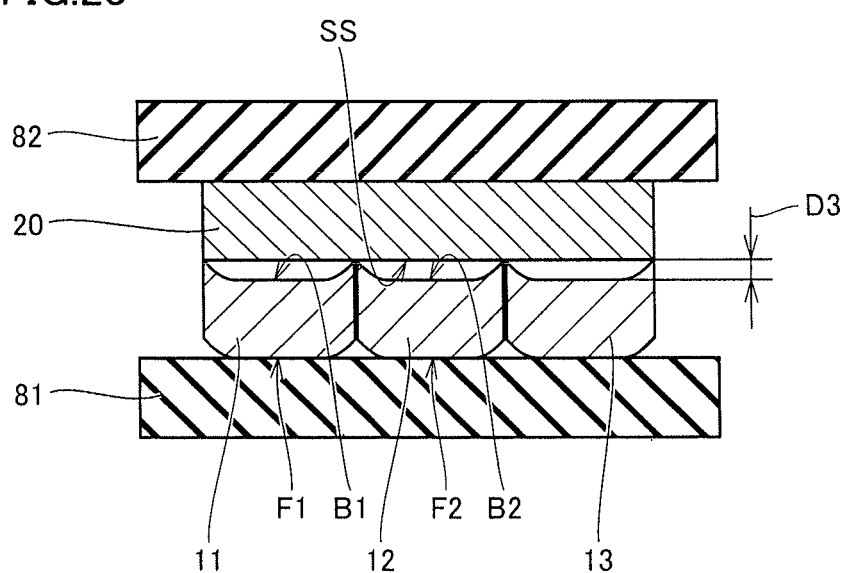
FIG. 23 is a cross sectional view schematically showing one step of a method for manufacturing a silicon carbide single crystal in a third variation of the third embodiment of the present invention.

Referring to FIG. 23, in a variation thereof, the space is secured by warpage of material substrates 11 to 13. More specifically, in the present variation, there is provided a space D3 that is locally zero but surely has an average value exceeding zero. Further, preferably, as with the average value of space D1, the average value of space D3 is set to be smaller than the mean free path for the sublimation gas in the sublimation method. For example, the average value is set to not less than 1 μm and not more than 1 cm.

It is to be noted that the space may be secured by combination of the respective methods shown in FIG. 22 and FIG. 23, i.e., by both the warpage of the silicon carbide wafer serving as solid source material 20 and the warpage of material substrates 11 to 13.

Each of the methods shown in FIG. 22 and FIG. 23 or the combination of these methods is particularly effective when the average value of the space is not more than 100 μm.

Fourth Embodiment

A method for manufacturing a seed substrate in the present embodiment and a variation thereof will be described below. Hereinafter, for ease of description, only material substrates 11 and 12 of material substrates 11 to 19 (FIG. 1) may be explained, but the same explanation also applies to material substrates 13 to 19.

Figure 24:
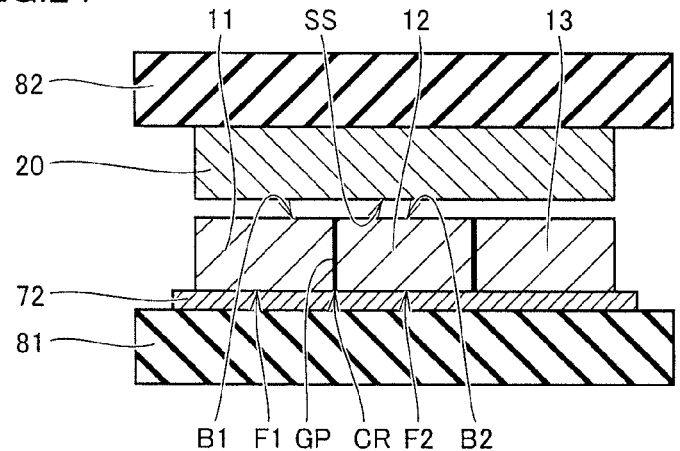
FIG. 24 is a cross sectional view schematically showing one step of a method for manufacturing a silicon carbide single crystal in a fourth embodiment of the present invention.

Referring to FIG. 24, in the present embodiment, a graphite sheet 72 (closing portion) having flexibility is disposed on the first heating member 81. Next, in the processing chamber, material substrates 11 and 12 are arranged on the first heating member 81 with graphite sheet 72 interposed therebetween such that each of back surfaces B1 and B2 is exposed in one direction (upward in FIG. 24). Thereafter, steps similar to those in the third embodiment are performed.

Apart from the configuration described above, the configuration of the present embodiment is substantially the same as the configuration of the third embodiment. Hence, the same or corresponding elements are given the same reference characters, and the description thereof will not be repeated.

According to the present embodiment, during the formation of supporting portion 30 in the same manner as in the third embodiment (FIGS. 18 to 20), a connecting portion similar to connecting portion BDa formed on cover 70 (FIG. 6) in the first embodiment is formed on graphite sheet 72 (FIG. 24). Namely, the step of forming the connecting portion to close opening CR of gap GP (FIG. 5) and accordingly connect side surfaces S1 and S2 can be continuously performed after the step of connecting each of back surfaces B1 and B2 to supporting portion 30. Hence, the steps are simplified as compared with a case of separately performing the step of forming the connecting portion and the step of connecting each of back surfaces B1 and B2.

Further, since graphite sheet 72 (FIG. 24) has flexibility, graphite sheet 72 can close gap GP in opening CR more securely.

Next, a variation of the present embodiment will be described.

Figure 25:
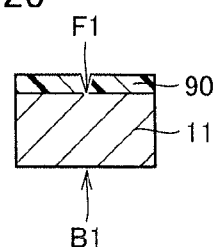
FIG. 25 is a cross sectional view schematically showing a first step of a method for manufacturing a silicon carbide single crystal in a variation of the fourth embodiment of the present invention.

Referring to FIG. 25, a resist liquid 90 similar to resist liquid 70P (FIG. 3) is applied onto front surface F1 of material substrate 11. Next, resist liquid 90 is carbonized using a method similar to the method by which resist liquid 70P is carbonized.

Figure 26:
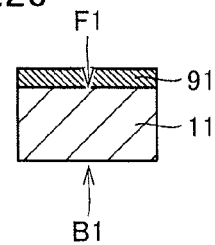
FIG. 26 is a cross sectional view schematically showing a second step of the method for manufacturing the silicon carbide single crystal in the variation of the fourth embodiment of the present invention.

Referring to FIG. 26, by the carbonization, there is provided a protective film 91, which covers the first front surface F1 of material substrate 11. Likewise, a protective film covering the second front surface F2 of material substrate 12 is also formed.

Figure 27:
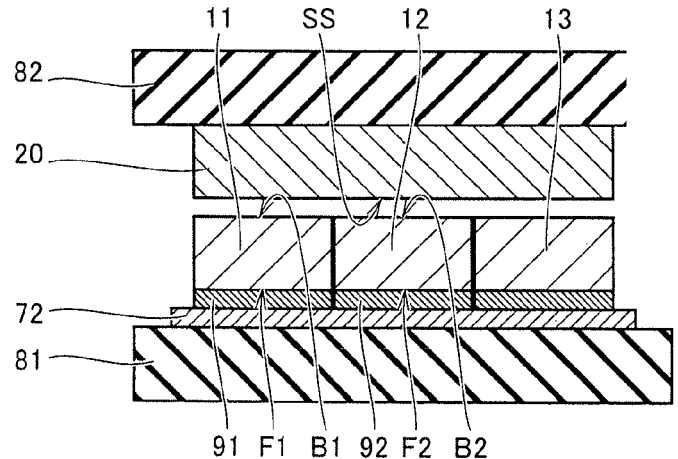
FIG. 27 is a cross sectional view schematically showing a third step of the method for manufacturing the silicon carbide single crystal in the variation of the fourth embodiment of the present invention.

Referring to FIG. 27, as in the present embodiment, material substrates 11 and 12 are arranged on the first heating member 81 with graphite sheet 72 interposed therebetween. However, in the present variation, at the time of this arrangement, protective film 91 has been formed on front surface F1 facing graphite sheet 72. Likewise, a protective film 92 similar to protective film 91 is formed on front surface F2 facing graphite sheet 72.

According to the present variation, during the formation of the connecting portion on graphite sheet 72, protective films 91 and 92 can serve to prevent sublimation/resolidification from taking place on front surfaces F1 and F2. Accordingly, front surfaces F1 and F2 can be prevented from being rough.

It is to be noted that, although the seed substrate has a rectangular shape in the embodiments described above, the seed substrate may have, for example, a circular shape. In this case, the diameter of the circular shape is preferably not less than 5 cm, and more preferably not less than 15 cm.

It should be understood that the embodiments disclosed herein are illustrative and non-restrictive in every respect. The scope of the present invention is defined by the scope of the claims, rather than the description above, and is intended to include any modifications within the scope and meaning equivalent to the scope of the claims.

REFERENCE SIGNS LIST 10, 10a: material substrate group, 11: material substrate (the first material substrate), 12: material substrate (the second material substrate), 13 to 19: material substrate, 20, 20p: solid source material, 21: coating film, 22: carbon film, 30, 30p: supporting portion, 31: adhesive, 32: fixing layer, 41: pedestal, 42: crucible, 51: source material, 52: silicon carbide single crystal, 52w: silicon carbide substrate, 70P: resist liquid, 70, 71: cover (closing portion), 72: graphite sheet (closing portion), 80a, 80P: seed substrate, 81: the first heating member, 82: the second heating member, 83: spacer, 90: resist liquid, 91, 92: protective film, B1: back surface (the first back surface), B2: back surface (the second back surface), BDa: connecting portion, CR: opening, DF: defect, F1: front surface (the first front surface), F2: front surface (the second front surface), GP, VDa: gap, S1: side surface (the first side surface), S2: side surface (the second side surface).

The invention claimed is:

1. A method for manufacturing a silicon carbide single crystal, comprising the steps of:
preparing a seed substrate having a supporting portion and first and second material substrates made of silicon carbide having a single-crystal structure, said first material substrate having a first back surface connected to said supporting portion, a first front surface opposite to said first back surface, and a first side surface connecting said first back surface and said first front surface, said second material substrate having a second back surface connected to said supporting portion, a second front surface opposite to said second back surface, and a second side surface connecting said second back surface and said second front surface, said first and second material substrates being arranged such that said first and second side surfaces face each other with a gap interposed therebetween, said gap having an opening between said first and second front surfaces;
forming a closing portion for closing said gap over said opening;
providing a connecting portion for closing said opening to said seed substrate by depositing a sublimate of silicon carbide from said first and second side surfaces onto said closing portion;
removing said closing portion after the step of providing said connecting portion;
epitaxially growing a silicon carbide single crystal that spans over said opening closed by said connecting portion, on said first and second front surfaces, after the step of removing said closing portion; and
removing said seed substrate.

2. The method for manufacturing the silicon carbide single crystal according to claim 1, wherein said supporting portion is made of silicon carbide.

3. The method for manufacturing the silicon carbide single crystal according to claim 2, wherein the step of preparing said seed substrate includes the step of forming said supporting portion by a sublimation method.

4. The method for manufacturing the silicon carbide single crystal according to claim 2, wherein each of said first and second material substrates has a crystal defect density lower than that of said supporting portion.

5. The method for manufacturing the silicon carbide single crystal according to claim 4, wherein said crystal defect density is defined by a micropipe density.

6. The method for manufacturing the silicon carbide single crystal according to claim 1, wherein said step of epitaxially growing is performed by a sublimation method.

7. The method for manufacturing the silicon carbide single crystal according to claim 1, wherein each of said silicon carbide single crystal and said first and second material substrates has a crystal structure of a hexagonal system.

8. The method for manufacturing the silicon carbide single crystal according to claim 7, wherein each of said first and second front surfaces has an off angle of not more than 10° from a {0001} plane.

9. The method for manufacturing the silicon carbide single crystal according to claim 8, wherein each of said first and second front surfaces is the {0001} plane.

10. The method for manufacturing the silicon carbide single crystal according to claim 7, wherein each of said first and second front surfaces has an off angle of not less than 80° from a {0001} plane.

11. The method for manufacturing the silicon carbide single crystal according to claim 7, wherein each of said first and second front surfaces has an off angle of not less than 50° and not more than 60° from a {0001} plane.

* * * * *